(12) United States Patent
Thompson et al.

(10) Patent No.: US 11,372,049 B2
(45) Date of Patent: Jun. 28, 2022

(54) METHOD AND SYSTEM TO DETERMINE POWER VALUES OF A BATTERY

(71) Applicant: Dell Products L.P., Round Rock, TX (US)

(72) Inventors: Richard C. Thompson, Cedar Park, TX (US); Merle Jackson Wood, Round Rock, TX (US); Mohammed K. Hijazi, Austin, TX (US); Adolfo S. Montero, Pflugerville, TX (US)

(73) Assignee: Dell Products L.P., Round Rock, TX (US)

(*) Notice: Subject to any disclaimer, the term of this patent is extended or adjusted under 35 U.S.C. 154(b) by 652 days.

(21) Appl. No.: 16/171,091

(22) Filed: Oct. 25, 2018

(65) Prior Publication Data

US 2020/0132778 A1  Apr. 30, 2020

(51) Int. Cl.
*G01R 1/28* (2006.01)
*G01R 31/367* (2019.01)
*G06F 1/28* (2006.01)
*G01R 31/388* (2019.01)
*G01R 31/392* (2019.01)
*G01R 31/3842* (2019.01)

(52) U.S. Cl.
CPC ......... *G01R 31/367* (2019.01); *G01R 31/388* (2019.01); *G01R 31/3842* (2019.01); *G01R 31/392* (2019.01); *G06F 1/28* (2013.01)

(58) Field of Classification Search
CPC ............................ G01R 31/367; G01R 31/392; G01R 31/3842; G01R 31/388; G06F 1/28
See application file for complete search history.

(56) References Cited

U.S. PATENT DOCUMENTS

| | | | | |
|---|---|---|---|---|
| 7,750,640 B2 * | 7/2010 | Yamabe | ............. | G01R 31/3648 324/426 |
| 8,670,799 B2 * | 3/2014 | Pattenden | ........... | H04M 1/0262 455/557 |
| 9,480,188 B2 * | 10/2016 | Orsini | .................... | G05B 15/02 |
| 9,494,656 B2 * | 11/2016 | Yao | ........................ | G01R 31/367 |
| 9,529,048 B2 * | 12/2016 | LePort | ................ | G01R 31/382 |
| 9,601,814 B2 * | 3/2017 | Brandt | ............. | H01M 10/4207 |
| 2010/0138177 A1 * | 6/2010 | Yu | ........................ | G01R 31/367 702/63 |

(Continued)

*Primary Examiner* — Alexander Satanovsky
*Assistant Examiner* — Lynda Dinh
(74) *Attorney, Agent, or Firm* — Baker Botts L.L.P.

(57) ABSTRACT

Methods, systems, and computer programs encoded on computer storage medium, for identifying, for a power source, a lookup table (LUT) that includes, for each condition of the power source, i) a maximum power (p-max) of the power source for the condition and ii) a sustained power (p-sus) of the power source for the condition; examining the LUT to define calibration triggers associated with the conditions; identifying an event that satisfies a particular calibration trigger of the calibration triggers; in response to identifying the event, creating a workload for the power source; in response to the workload, determining for a particular condition associated with the particular calibration trigger, an updated p-max value for the particular condition and an updated p-sus value of the power source for the particular condition; and updating the LUT, for the particular condition, based on the updated p-max value and the updated p-sus value.

11 Claims, 5 Drawing Sheets

(56) References Cited

U.S. PATENT DOCUMENTS

2013/0275782 A1* 10/2013 Svilan ................ G06F 1/3203
713/300
2015/0340897 A1* 11/2015 Uan-Zo-Li ............ H02J 7/342
320/103

* cited by examiner

METHOD AND SYSTEM TO DETERMINE POWER VALUES OF A BATTERY

BACKGROUND

Field of the Disclosure

The disclosure relates generally to information handling systems, and, more particularly, to a system and method for determining power values of a battery and updating a corresponding table.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in methods that includes identifying, for a power source of a computing device, a lookup table (LUT) that includes, for each condition of one or more conditions of the power source, i) a maximum power (p-max) of the power source for the condition and ii) a sustained power (p-sus) of the power source for the condition; examining, by an embedded controller of the computing device, the LUT to define one or more calibration triggers associated with the one or more conditions; identifying, by the enclosure controller, an event that satisfies a particular calibration trigger of the one or more calibration triggers; in response to identifying the event that satisfies the particular calibration trigger, creating a workload for the power source; in response to the workload, determining, by the enclosure controller and for a particular condition associated with the particular calibration trigger, an updated p-max value for the particular condition and an updated p-sus value of the power source for the particular condition; and updating the LUT, for the particular condition, based on the updated p-max value and/or the updated p-sus value.

Other embodiments of these aspects include corresponding system, apparatus, and computer programs, configured to perform the actions of the methods, encoded on computer storage devices.

These and other embodiments may each optionally include one or more of the following features. For instance, the conditions of the power source can include a temperature of the power source, an age of the power source, and a state of charge of the power source. The age of the power source can include a charge cycle count of the power source. The age of the power source can include a chronological age of the power source. The age of the power source can further include a "state of health"—a present condition/performance of the power source relative to a previous condition/performance (e.g., when first used). In other words, the state of health can include the maximum capacity of the power source compared to an original capacity of the power source. Creating the workload for the power source can include creating a power virus for the power source. Identifying the event that satisfies the particular calibration trigger includes identifying a change in one of the conditions of the power source. Identifying the event that satisfies the particular calibration trigger includes identifying an increase power consumption by a computer-implemented application executable by an operating system of the computing device. Identifying the event that satisfies the particular calibration trigger includes identifying a system hardware integration change associated with the computing device.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This document describes methods, systems, and computer readable medium for determining battery power levels, and updating a corresponding table. Specifically, the ability of a power source (e.g., battery) to support high power pulse can be dependent upon, among other things, the battery rating, the instantaneous charge level (SOC), temperature, and age. To quantify a battery, the battery can be associated with a maximum peak power (p-max) and sustained peak power (p-sus). However, if there is an error in the calculation of such power values or reporting of such, the result can include either an overly conservative system operation and/ or a power event may cause the system to crowbar (fall below a minimum voltage threshold) if the settings are too aggressive. Further, as the power source degrades, the power source suffers from increased battery impedance, and thus, a higher voltage drop for the same amount of current. As a result, a minimum voltage threshold can be obtained easier as the power source degrades.

This document describes a method and system for calculating table values for the power values of the battery to cover a broad range of system configurations, using triggered messaging to the battery to log calibration cycles to derive more accurate power (p-max or p-sus) values. In some examples, such values can be obtained during power on self-test (POST) every n number of boot cycles (to calibrate the maximum load for a particular system configuration using a "power virus"). Furthermore, different levels of power spikes can be obtained by varying the amount of BIOS firmware loading. This can allow calibration to start at lower load levels until a maximum level is increased such that the battery capabilities are not exceeded.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Figure 1:
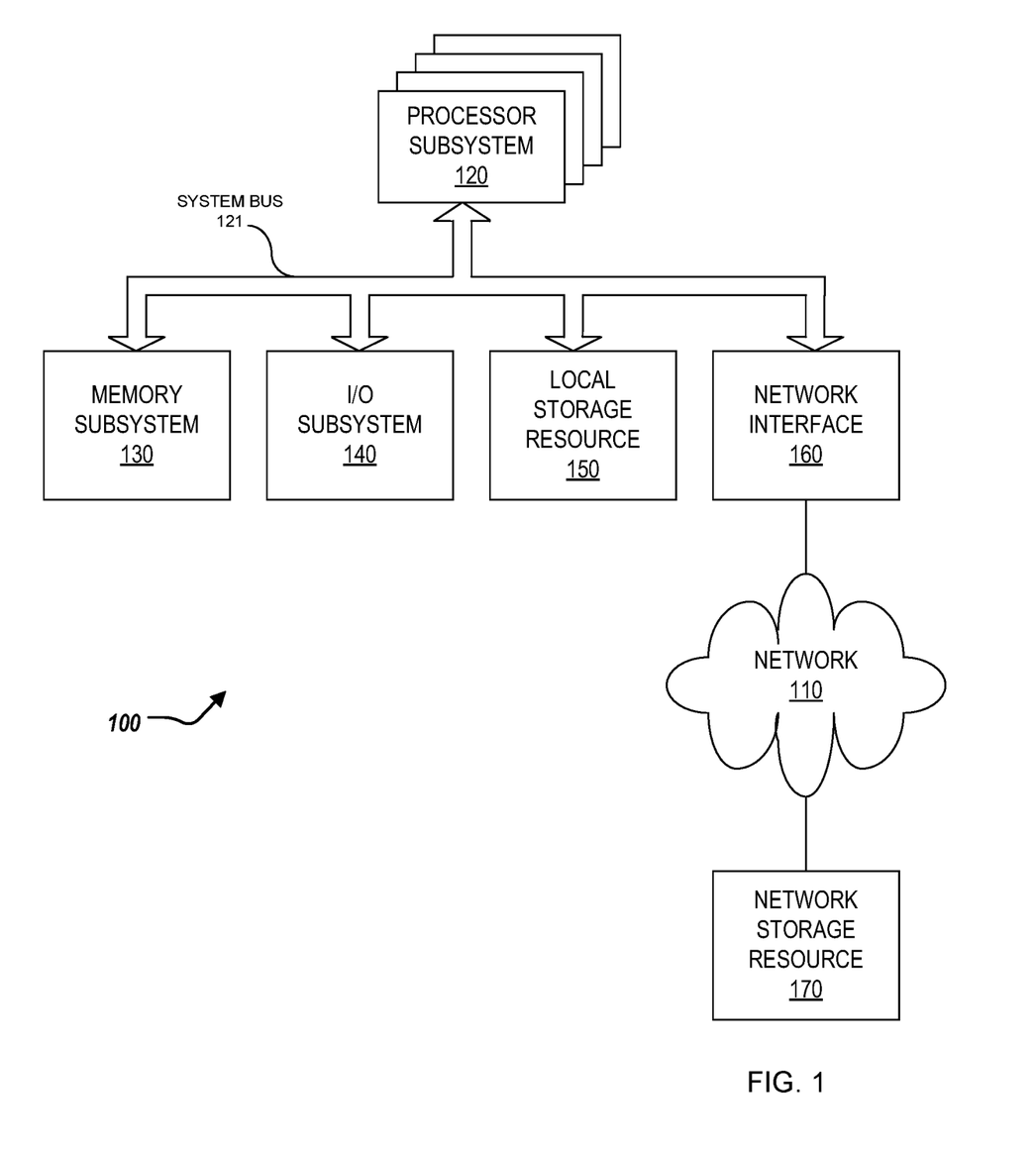
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
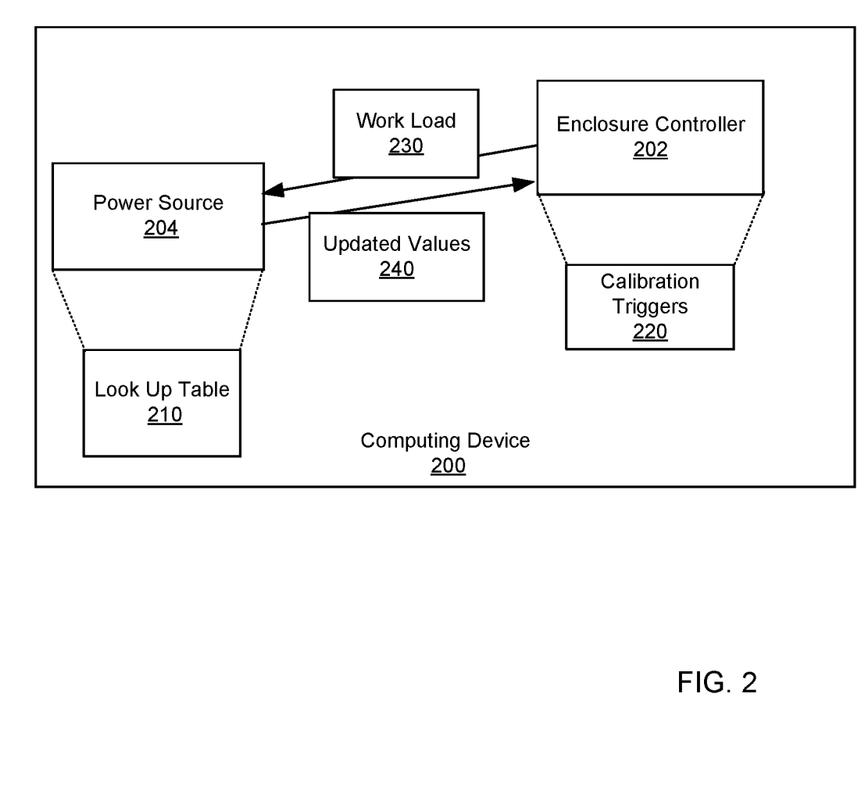
FIG. 2 illustrates an environment a computing device for determining battery power values.

Turning now to FIG. 2, FIG. 2 depicts a computing device 200. The computing device 200 can include an embedded (enclosure) controller 202 and a power source 204. The enclosure controller 202 can be in communication with the power source 204. In some examples, the computing device 200 can correspond to the information handling system 100 of FIG. 1. In some examples, the power source 204 can include a battery (or battery cell), or a series of batteries (or battery cells).

The power source 204 can further include, e.g., store or provide access to, a lookup-table (LUT) 210. In some examples, the power source 204 can store the LUT 210, alone or in coordination with a database (not shown). The LUT 210 can store, for conditions of the power source 204, a power availability of the power source 204. For example, the conditions can include an age of the power source 204, a state of charge (SOC) of the power source 204, and a temperature of the power source 204. In some examples, the age of the power source 204 can include a charge cycle count of the power source 204. In some examples, the age of the power source 204 can include a chronological age of the power source 204. In some examples, the age of the power source 204 can include an impedance of the power source 204. However, the LUT 210 can store the power availability of the power source 204 for any type of condition that is desired.

For one or more combinations of the conditions of the power source, the LUT 210 can store associated power values of the power source 204. In other words, for a particular combination of age, SOC, and temperature of the power source 204, the LUT 210 stores an associated power availability of the power source 204 (power availability of the power source 204 decreases as an impedance of the power source 204 increases). Thus, for differing conditions of the power source 204, there are differing associated power values of the power source 204. In some examples, the LUT 210 can store a power value of the power source 204 for each condition of the power source 204.

In particular, the LUT 210 can store, for one or more conditions of the power source 204, a maximum power (p-max) of the power source 204 for each of the conditions and a sustained power (p-sus) of the power source 204 for each of the conditions. The maximum power of the power source 204 can be a maximum power the power source 204 can support without dropping below a threshold (or minimum) voltage. For example, the maximum power of the power source 204 can be a maximum peak power of the power source 204, and on the order of milliseconds. The sustained power of the power source 204 can be a sustained power of the power source 204 without dropping below the threshold (or minimum) voltage. For example, the sustained power of the power source 204 can be a sustained peak power of the power source 204, and on the order of tens of seconds.

To that end, the enclosure controller 202 can receive, from the power source 204, data indicating the voltage of the power source 204 and the SOC of the power source 204 (e.g., at the time of sending the data to the enclosure controller 202). The data can further include, at any particular time, the maximum power and the sustained power of the power source 204 (e.g., based on the LUT 210 and the current conditions of the power source 204). In some examples, the power source 204 provides such data in response to a request from the enclosure controller 202, or automatically. For example, the power source 204 can provide data indicating that for the power source 204 including a 50-watt hour battery and for the current conditions of the power source 204, a maximum power of the power source 204 is 100-watts for 10 milliseconds, and a sustained power of the power source is 60 watts for 10 seconds.

The enclosure controller 202 can examine the LUT 210 to define one or more calibration triggers 220 associated with the conditions of the power source 204. Specifically, the enclosure controller 202 can identify one or more values of the LUT 210 that can be stale or in need of updating. For example, for a certain condition of the power source 204, the associated power values can be stale or in need of updating. To that end, the enclosure controller 202 can define calibration triggers 220 based on such conditions that associated power values need to be updated for. For example, the enclosure controller 202 can define a calibration trigger 220 as when the power source 204 has experienced a 25-charge cycle count, and new power values are needed for this condition of the power source 204. For example, the enclosure controller 202 can define a calibration trigger 220 when the power source 204 reaches a particular temperature (e.g., 30 degrees Fahrenheit), and new power values are needed for this condition for the power source 204 (e.g., the power values are stale, or need to be updated).

The enclosure controller 202 can identify an event that satisfies a particular calibration trigger of the calibration triggers 220. In some examples, the enclosure controller 202 can identify a change in one of the conditions of the power source 204 as the event. Specifically, the enclosure controller 202 can identify that the age, temperature, or SOC of the power source 204 has changed (e.g., changed a threshold amount). For example, the power source 204 can have experienced a $25^{th}$-charge of a 25-charge cycle count, and the enclosure controller 202 can determine that such an event satisfies a particular calibration trigger 220. For example, the power source 204 can be at a 30-degree Fahrenheit temperature, and the enclosure controller 202 can determine that such an event satisfies a particular calibration trigger 220.

In some examples, the enclosure controller 202 can identify an increased power consumption by a computer-implemented application executable by an operating system of the computing device 200 as the event. In some examples, the enclosure controller 202 can identify a system hardware integration change associated with the computing device 200 as the event. For example, a storage device (not shown) of the computing device 200 can be changed, or an external device (not shown) is coupled to the computing device 200. The system hardware integration change can include adding, removing, or adjusting hardware components of the computing device 200.

The enclosure controller 202, in response to identifying the event that satisfies the particular calibration trigger 220, creates a workload 230 for the power source 202. For example, the enclosure controller 202 can create a power virus for the power source 204. The enclosure controller 202, in response to the workload, determines, for a particular condition associated with the particular calibration trigger 220, updated values 240 for the particular condition. Specifically, the enclosure controller 202, for the particular condition where updated values are needed, determines an updated maximum power value for the particular condition and an updated sustained power value for the particular condition. That is, the power source 204 is ran (or tested) for the particular condition, and communicates the updated power values 240 to the enclosure controller 202. For example, the power source 204 can be ran (or tested) for a condition of when the battery is at 30-degrees Fahrenheit based on the workload 230 and communicates updated power values 240 for such a condition. The enclosure controller 202 can update the LUT 210, for the particular condition, based on the updated power values 240, and specifically, the updated maximum power value and sustained power value. The updated power values will also indirectly reflect on the impedance change of the power source 204.

Figure 3:
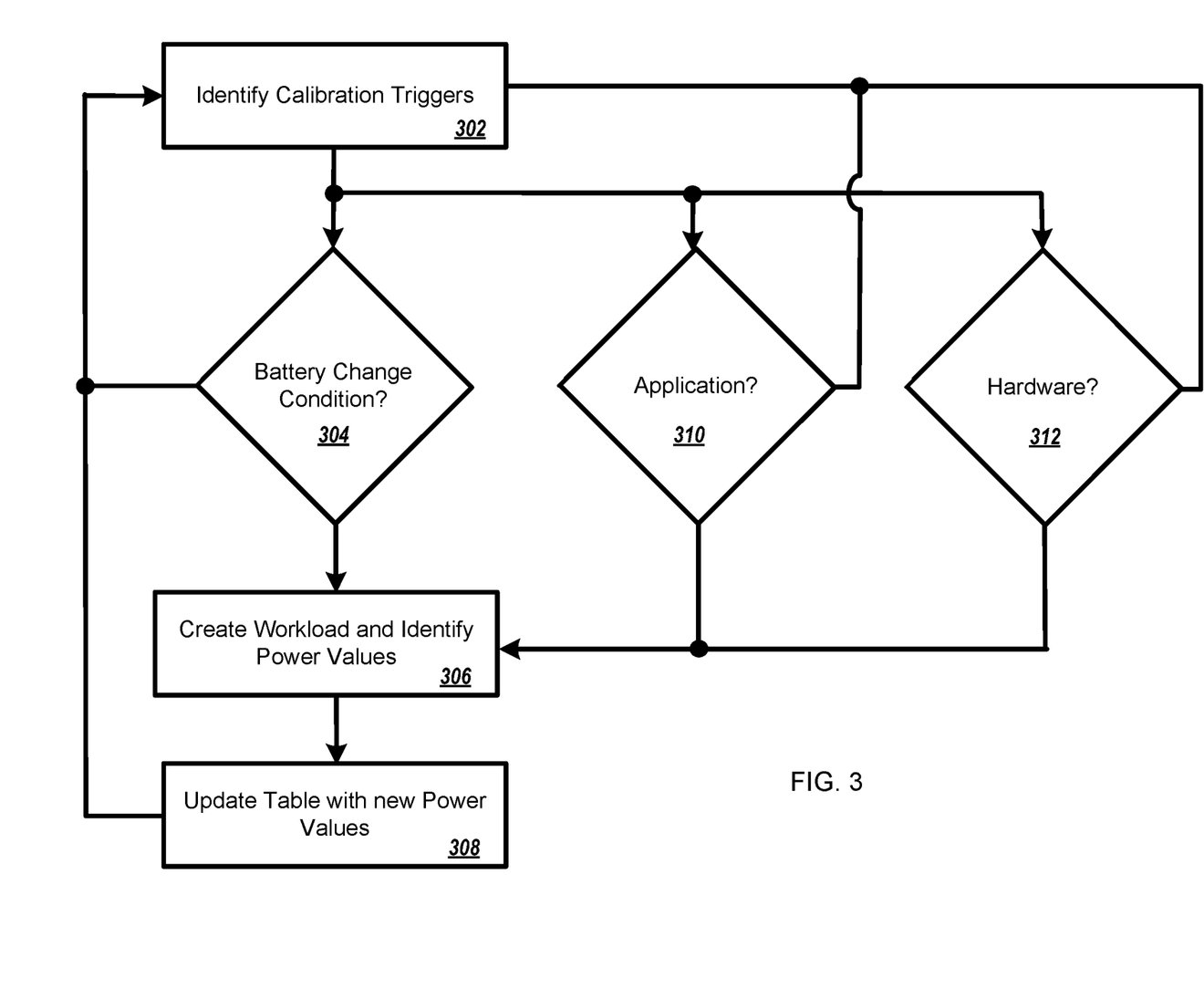
FIG. 3 illustrates a flowchart for proactively determining power levels of a battery.

FIG. 3 illustrates a flowchart depicting selected elements of an embodiment of a method 300 for proactively determining power levels of a battery. The method 300 may be performed by the information handling system 100 and/or the computing device 200 described herein with reference to FIGS. 1 and 2, or another information handling system. It is noted that certain operations described in method 300 may be optional or may be rearranged in different embodiments.

The enclosure controller 202 monitors the LUT 210 to identify the calibration triggers 220 (302). Specifically, the enclosure controller 202 can identify one or more values of the LUT 210 that can be stale or in need of updating. The enclosure controller 202 determines whether an event associated with a battery change condition triggers ones of the calibration triggers 220 (304). For example, the enclosure controller 202 can identify that the age, temperature, or SOC of the power source 204 has changed (e.g., changed a threshold amount). If the enclosure controller 202 determines that the event associated with the battery change condition triggers one of the calibration triggers 220, the enclosure controller 202 creates the workload 230 for the power source 202 and identifies updated power values 240 based on the workload 230 (306). The enclosure controller 202 then updates the LUT 210 based on the updated power values 240 (308). If the enclosure controller 202 determines that the event associated with the battery change condition does not satisfy one of the calibration triggers 220, the enclosure controller 220 proceeds to monitoring the LUT 210 at step 302.

Concurrently with determining whether an event associated with a battery change condition triggers one of the calibration triggers 220 at step 304, the enclosure controller 202 determines whether an event associated with a computer-implemented application is occurring an increased power consumption that triggers one of the calibration triggers 220 (310). If the enclosure controller 202 determines that the event associated with an event associated with a computer-implemented application is occurring an increased power consumption that triggers one of the calibration triggers 220, the enclosure controller 202 creates the workload 230 for the power source 202 and identifies updated power values 240 based on the workload 230 (306). The enclosure controller 202 then updates the LUT 210 based on the updated power values 240 (308). If the enclosure controller 202 determines that the event associated with a computer-implemented application is occurring an increased power consumption that triggers one of the calibration triggers 220 does not satisfy one of the calibration triggers 220, the enclosure controller 220 proceeds to monitoring the LUT 210 at step 302.

Concurrently with determining whether an event associated with a battery change condition triggers one of the calibration triggers 220 at step 304, and determining whether an event associated with a computer-implemented application is occurring an increased power consumption that triggers one of the calibration triggers 220 at step 310, the enclosure controller 202 determines whether an event associated with a system hardware integration change triggers one of the calibration triggers 220 (312). If the enclosure controller 202 determines that the event associated with a system hardware integration change triggers one of the calibration triggers 220, the enclosure controller 202 creates the workload 230 for the power source 202 and identifies updated power values 240 based on the workload 230 (306).

The enclosure controller 202 then updates the LUT 210 based on the updated power values 240 (308). If the enclosure controller 202 determines that a system hardware integration change does not trigger one of the calibration triggers 220, the enclosure controller 220 proceeds to monitoring the LUT 210 at step 302.

Figure 4:
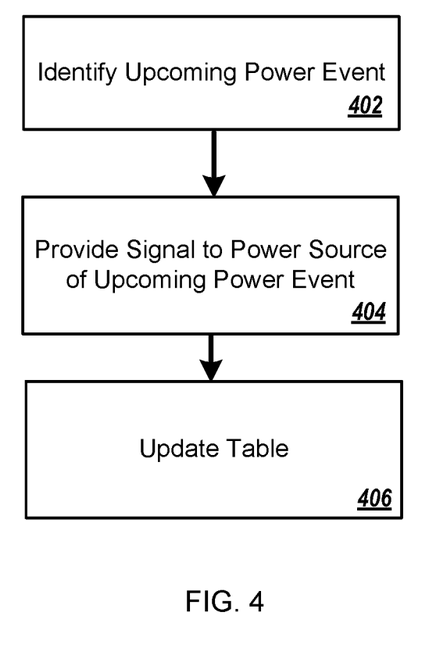
FIG. 4 illustrates a flowchart for reactively determining power levels of a battery.

FIG. 4 illustrates a flowchart depicting selected elements of an embodiment of a method 400 for reactively determining power levels of a battery. The method 400 may be performed by the information handling system 100 and/or the computing device 200 described herein with reference to FIGS. 1 and 2, or another information handling system. It is noted that certain operations described in method 400 may be optional or may be rearranged in different embodiments.

The enclosure controller 202 identifies an upcoming power event (402). For example, by synchronizing with the BIOS of the computing device 202, the enclosure controller 202 can identify an upcoming power event (e.g., high-load condition). The enclosure controller 202 can provide a signal to the power source 204 indicating the upcoming power event (e.g., a few milliseconds prior to such power event) (404). The enclosure controller 202 then updates the LUT 210 based on updated power values 240 in response to the power event (406).

Figure 5:
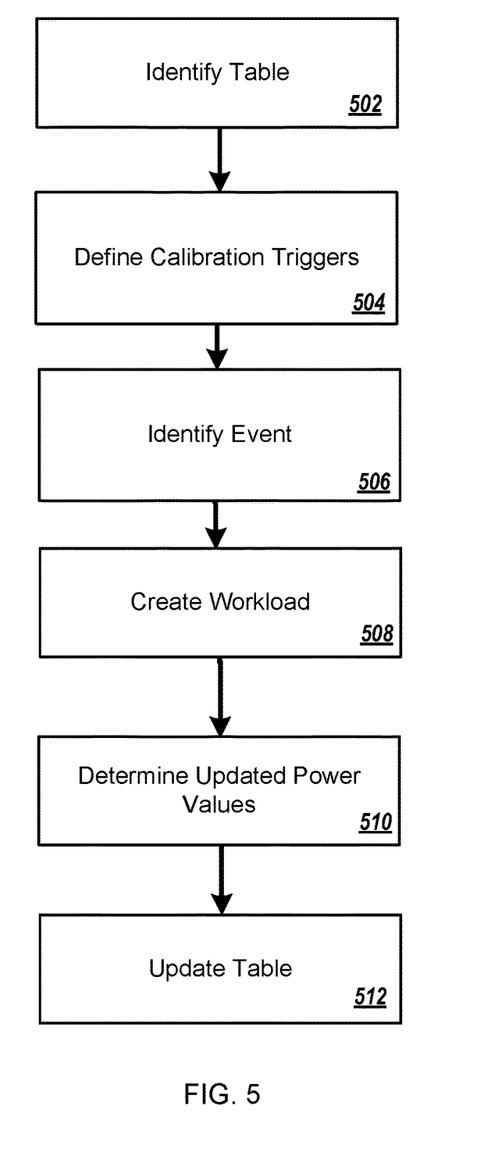
FIG. 5 illustrates a flowchart for determining power levels of a battery and updating a table.

FIG. 5 illustrates a flowchart depicting selected elements of an embodiment of a method 500 for determining power levels of a battery and updating a table. The method 500 may be performed by the information handling system 100 and/or the computing device 200 described herein with reference to FIGS. 1 and 2, or another information handling system. It is noted that certain operations described in method 500 may be optional or may be rearranged in different embodiments.

The enclosure controller 204 can identify the LUT 210 (502). The LUT 210 can store, for one or more conditions of the power source 204, a maximum power (p-max) of the power source 204 for each of the conditions and a sustained power (p-sus) of the power source 204 for each of the conditions. The enclosure controller 202 can examine, the LUT 210 to define one or more calibration triggers 220 associated with the conditions of the power source 204 (504). Specifically, the enclosure controller 202 can identify one or more values of the LUT 210 that can be stale or in need of updating. The enclosure controller 202 can identify an event that satisfies a particular calibration trigger of the calibration triggers 220 (506). In some examples, the enclosure controller 202 can identify a change in one of the conditions of the power source 204 as the event. In some examples, the enclosure controller 202 can identify an increased power consumption by a computer-implemented application executable by an operation system of the computing device 200 as the event. In some examples, the enclosure controller 202 can identify a system hardware integration change associated with the computing device 200 as the event (e.g., a power intensive hardware integration change that is likely to cross a low voltage threshold). The enclosure controller 202, in response to identifying the event that satisfies the particular calibration trigger 220, create the workload 230 for the power source 202 (508). For example, the enclosure controller 202 can create a power virus for the power source 204. The enclosure controller 202, in response to the workload, determines, for a particular condition associated with the particular calibration trigger 220, updated values 240 for the particular condition (510). The enclosure controller 202 can update the LUT 210, for the particular condition, based on the updated power values 240, and specifically, the updated maximum power value and sustained power value (512).

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computer-implemented method, comprising:
identifying, for a power source of a computing device, a lookup table (LUT) that includes, for each condition of a plurality of conditions of the power source, i) a maximum power (p-max) of the power source for the condition and ii) a sustained power (p-sus) of the power source for the condition;
examining, by an enclosure controller of the computing device, the LUT to define calibration triggers associated with respective conditions of the plurality of conditions;
determining whether a charge cycle count of the power source meets a threshold to satisfy a first calibration trigger of the calibration triggers;
concurrently with determining whether the charge cycle count of the power source meets the threshold, determining whether an integration of external hardware components of the computing device has occurred that satisfies a second calibration trigger;
concurrently with determining whether the integration of the external hardware components of the computing device occurred, determining whether an increase in power consumption by a computer-implemented application executable by an operating system of the computing device has occurred that satisfies a third calibration trigger;

determining that each of the first calibration trigger, the second calibration trigger, and the third calibration trigger is satisfied, and in response, creating a workload for the power source;

in response to creating the workload for the power source, executing, for a particular condition of the one or more conditions associated with the calibration triggers, the workload at the power source;

determining, by the enclosure controller and based on the executed workload, an updated p-max value for the particular condition and an updated p-sus value of the power source for the particular condition; and updating the LUT, for the particular condition, based on the updated p-max value and the updated p-sus value.

2. The method of claim 1, wherein the one or more conditions of the power source include one or more of a temperature of the power source, an age of the power source, and a state of charge of the power source.

3. The method of claim 2, wherein the age of the power source includes the charge cycle count of the power source.

4. The method of claim 2, wherein the age of the power source includes a chronological age of the power source, or an impedance of the power source.

5. The method of claim 1, wherein creating the workload for the power source includes creating a power virus for the power source.

6. A system comprising a processor having access to non-transitory memory media storing instructions executable by the processor to:
identifying, for a power source of a computing device, a lookup table (LUT) that includes, for each condition of a plurality of conditions of the power source, i) a maximum power (p-max) of the power source for the condition and ii) a sustained power (p-sus) of the power source for the condition;

examining, by an enclosure controller of the computing device, the LUT to define calibration triggers associated with respective conditions of the plurality of conditions;

determining whether a charge cycle count of the power source meets a threshold to satisfy a first calibration trigger;

concurrently with determining whether the charge cycle count of the power source meets the threshold, determining whether an integration of external hardware components of the computing device has occurred that satisfies a second calibration trigger;

concurrently with determining whether the integration of the external hardware components of the computing device occurred, determining whether an increase in power consumption by a computer-implemented application executable by an operating system of the computing device has occurred that satisfies the particular calibration trigger;

determining that each of the first calibration trigger, the second calibration trigger, and the third calibration trigger is satisfied, and in response, creating a workload for the power source;

in response to creating the workload for the power source, executing, for a particular condition of the one or more conditions associated with the calibration triggers, the workload at the power source;

determining, by the enclosure controller and based on the executed workload, an updated p-max value for the particular condition and an updated p-sus value of the power source for the particular condition; and updating the LUT, for the particular condition, based on the updated p-max value and the updated p-sus value.

7. The system of claim 6, wherein the one or more conditions of the power source include one or more of a temperature of the power source, an age of the power source, and a state of charge of the power source.

8. The system of claim 7, wherein the age of the power source includes charge cycle count of the power source.

9. The system of claim 7, wherein the age of the power source includes a chronological age of the power source, or an impedance of the power source.

10. The system of claim 6, wherein creating the workload for the power source includes creating a power virus for the power source.

11. A non-transitory computer-readable medium storing software comprising instructions executable by one or more computers which, upon such execution, cause the one or more computers to perform operations comprising:
identifying, for a power source of a computing device, a lookup table (LUT) that includes, for each condition of a plurality of conditions of the power source, i) a maximum power (p-max) of the power source for the condition and ii) a sustained power (p-sus) of the power source for the condition;

examining, by an enclosure controller of the computing device, the LUT to define calibration triggers associated with respective conditions of the plurality of conditions;

determining whether a charge cycle count of the power source meets a threshold to satisfy a first calibration trigger;

concurrently with determining whether the charge cycle count of the power source meets the threshold, determining whether an integration of external hardware components of the computing device has occurred that satisfies a second calibration trigger;

concurrently with determining whether the integration of the external hardware components of the computing device occurred, determining whether an increase in power consumption by a computer-implemented application executable by an operating system of the computing device has occurred that satisfies the particular calibration trigger;

determining that each of the first calibration trigger, the second calibration trigger, and the third calibration trigger is satisfied, and in response, creating a workload for the power source;

in response to creating the workload for the power source, executing, for a particular condition of the one or more conditions associated with the calibration triggers, the workload at the power source;

determining, by the enclosure controller and based on the executing workload, an updated p-max value for the particular condition and an updated p-sus value of the power source for the particular condition; and updating the LUT, for the particular condition, based on the updated p-max value and the updated p-sus value.

* * * * *